United States Patent [19]
Ogoro

[11] Patent Number: 5,706,315
[45] Date of Patent: Jan. 6, 1998

[54] AUTOMATIC FREQUENCY CONTROL DEVICE FOR TUNING AN INTERMEDIATE FREQUENCY SIGNAL TO A TARGET FREQUENCY

[75] Inventor: Kazuo Ogoro, Tokyo, Japan

[73] Assignee: NEC Corporation, Tokyo, Japan

[21] Appl. No.: 505,848

[22] Filed: Jul. 24, 1995

[30] Foreign Application Priority Data

Jul. 25, 1994 [JP] Japan ................................. 6-172209

[51] Int. Cl.$^6$ ................................................. H04L 27/06
[52] U.S. Cl. .................. 375/344; 455/182.2; 455/192.2; 455/196.1
[58] Field of Search .................... 315/344; 455/182.1, 455/182.2, 192.2, 196.1, 259, 258, 264, 316

[56] References Cited

U.S. PATENT DOCUMENTS

| | | | |
|---|---|---|---|
| 3,085,210 | 4/1963 | Etal | 455/259 |
| 3,626,301 | 12/1971 | Develet | 455/264 |
| 4,556,988 | 12/1985 | Yoshisato | 455/192.2 |
| 5,457,716 | 10/1995 | Ang et al. | 375/344 |
| 5,461,645 | 10/1995 | Ishii | 375/344 |

FOREIGN PATENT DOCUMENTS

| | | |
|---|---|---|
| 0454266A2 | 10/1991 | European Pat. Off. . |
| 0500025A2 | 8/1992 | European Pat. Off. . |
| 5227237 | 9/1993 | Japan . |
| 2205460 | 12/1988 | United Kingdom . |
| 2244877 | 12/1991 | United Kingdom . |
| 2273405 | 6/1994 | United Kingdom . |
| 2278968 | 12/1994 | United Kingdom . |

OTHER PUBLICATIONS

British Search Report.

*Primary Examiner*—Stephen Chin
*Assistant Examiner*—Don Vo
*Attorney, Agent, or Firm*—Whitham, Curtis, Whitham & McGinn

[57] ABSTRACT

In an automatic frequency control device for tuning the frequency of an intermediate frequency (IF) signal to a desired or target frequency, a frequency mixer subtracts the frequency of a received signal coming in through an antenna from the frequency of a local oscillation signal output from a voltage controlled oscillator. A reference oscillator outputs a reference oscillation signal on the basis of a control voltage from a digital/analog converter. The local oscillation signal from the voltage controlled oscillator is synchronous in phase to the reference oscillation signal. A frequency measurement circuit measures the frequency of the IF signal. A subtracter subtracts the frequency of the IF signal from the target frequency and thereby produces a frequency error. A multiplier multiplies the frequency error by, in a proportional relation between the frequency of the IF signal and a voltage represented by a control voltage signal, the reciprocal of a gradient of the voltage of the control voltage signal to the frequency of the IF signal. An adder adds the control voltage signal to the output of the multiplier, thereby correcting the control voltage signal. The digital/analog converter converts the control voltage signal to an analog signal and thereby outputs the control voltage.

10 Claims, 6 Drawing Sheets

AUTOMATIC FREQUENCY CONTROL DEVICE FOR TUNING AN INTERMEDIATE FREQUENCY SIGNAL TO A TARGET FREQUENCY

BACKGROUND OF THE INVENTION

The present invention relates to an automatic frequency control device and, more particularly, to an automatic frequency control device for tuning an intermediate frequency (IF) signal to a desired or target frequency by correcting a control voltage which controls a local oscillation signal.

A heterodyne reception system is conventional which converts a received signal to an IF signal lower in frequency than the received signal and then demodulates the IF signal, as distinguished from a traditional direct demodulation system. A radio apparatus using the heterodyne reception system needs a stable IF signal undergoing a minimum of frequency change.

In the heterodyne reception system, a local signal is mixed with the received signal to produce the IF signal. The frequency of the IF signal should preferably remain constant in order to obviate the demodulation errors of a demodulator included in the system. However, the frequency of the IF signal is apt to change due to various causes including changes in the frequency of the received signal, and the insufficient accuracy of an oscillator generating the local signal. In light of this, an automatic frequency control circuit capable of measuring the frequency of the IF frequency and correcting it to a predetermined value is available, as taught in, for example, Japanese Laid-Open Patent Application No. 5-227237.

The automatic frequency control circuit generates an IF signal by mixing a received signal and a local oscillation signal. The frequency of the IF signal is measured, and the resulting frequency data is transformed to voltage data by a voltage data converter. The frequency data and voltage data are preselected and correspond one-to-one to each other. Because the frequency of the local oscillation signal is controlled by the voltage data, the IF signal is tuned to a target frequency. The above document, however, does not teach a method of producing voltage data for each frequency data specifically.

A specific method and circuitry for correcting voltage data on the basis of frequency data are incorporated in a reception frequency control circuit disclosed in pending U.S. patent application Ser. No. 08/365/574. This control circuit was filed at Japanese Patent Office on Dec. 28, 1993 by the same applicant as the present application, and filed at U.S. Patent Office on Dec. 28, 1994. The control circuit has a frequency mixer, a reference oscillation circuit, a local oscillation circuit, a frequency measurement circuit, a first frequency correction circuit, a subtracter, a second frequency correction circuit, a decision circuit, and a digital/analog (D/A) converter.

In the above control circuit, a holding circuit outputs, in response to power-up, a control voltage signal which it has held. The D/A converter converts the control voltage signal to an analog control voltage. The reference oscillation circuit outputs a reference oscillation signal on the basis of the control voltage. The local oscillation circuit produces a local oscillation signal synchronous in phase to the reference oscillation signal. The frequency mixer subtracts the frequency of a received signal from the frequency of the local oscillation signal, thereby outputting an IF signal. The frequency measurement circuit measures the frequency of the IF signal. The first frequency correction circuit detects a frequency displacement due to the QPSK modulation of the IF signal. The subtracter subtracts the frequency displacement of the IF signal from the frequency of the IF signal and thereby outputs the frequency of the IF signal free from the displacement. The decision circuit determines whether or not the IF frequency output from the subtracter has been tuned to a target frequency. When the result of the decision is negative, the second frequency correction circuit adds or subtracts a predetermined value to or from the control voltage signal and thereby corrects the control voltage signal.

The control circuit having the above configuration has the following problem left unsolved. When the frequency of the IF signal is not tuned to the target frequency, as determined by the decision circuit, a predetermined value is added to or subtracted from the control voltage signal in order to control the frequency of the reference oscillation signal. The control circuit, therefore, must repeat such correction several times until the IF signal has been tuned to the target frequency, consuming a substantial period of time. Particularly, in automatic frequency control conventional with a radio apparatus having a battery saving feature, the frequency of the reference oscillation signal fluctuates over a substantial range in the event of power-up. This type of apparatus, therefore, needs automatic frequency control capable of tuning the IF signal to the target frequency rapidly.

SUMMARY OF THE INVENTION

It is, therefore, an object of the present invention to provide an automatic frequency control device capable of tuning an IF frequency to a target frequency by correcting a control voltage only once.

It is another object of the present invention to provide an automatic frequency control device capable of correcting a control voltage on the basis of a proportional relation between the control voltage and the frequency of an IF signal.

It is a further object of the present invention to provide an automatic frequency control device capable of correcting a control voltage by multiplying a difference of an IF signal from a target frequency by the reciprocal of a gradient tan θ of the frequency of the IF signal relative to the control voltage, and adding the control voltage to the resulting product.

In order to achieve the above objects, an automatic frequency control device of the present invention has a control voltage generator for outputting a control voltage. A reference oscillator outputs a reference oscillation signal on the basis of the control voltage. A local oscillator outputs a local oscillation signal synchronous in phase to the reference oscillation signal. A frequency mixer mixes a received signal and the local oscillation signal and outputs the result as an IF signal. A measurement circuit measures the frequency of the IF signal. A frequency error detector detects a difference of the frequency of the IF signal from the target frequency. A multiplier multiplies the frequency error by, in a proportional relation between the control voltage and the frequency of the IF signal, the reciprocal of a gradient of the control voltage relative to the frequency of the IF signal. An adder adds the resulting product to the control voltage.

In the above construction, the multiplier multiplies the frequency error by the reciprocal of the gradient of the control voltage relative to the frequency of the IF signal, and the adder adds the product to the control voltage. Hence, the control voltage is corrected by a value corresponding to the frequency error on the basis of the proportional relation between the control voltage and the frequency of the IF signal. As a result, the IF signal corrected and output on the basis of the control voltage can be tuned to the target frequency if the correction is executed only once.

BRIEF DESCRIPTION OF THE DRAWINGS

These and other objects, features and advantages of the invention will become more fully apparent from the following detailed description taken in conjunction with the accompanying drawings in which.

DETAILED DESCRIPTION OF THE PREFERRED EMBODIMENT

Figure 1:
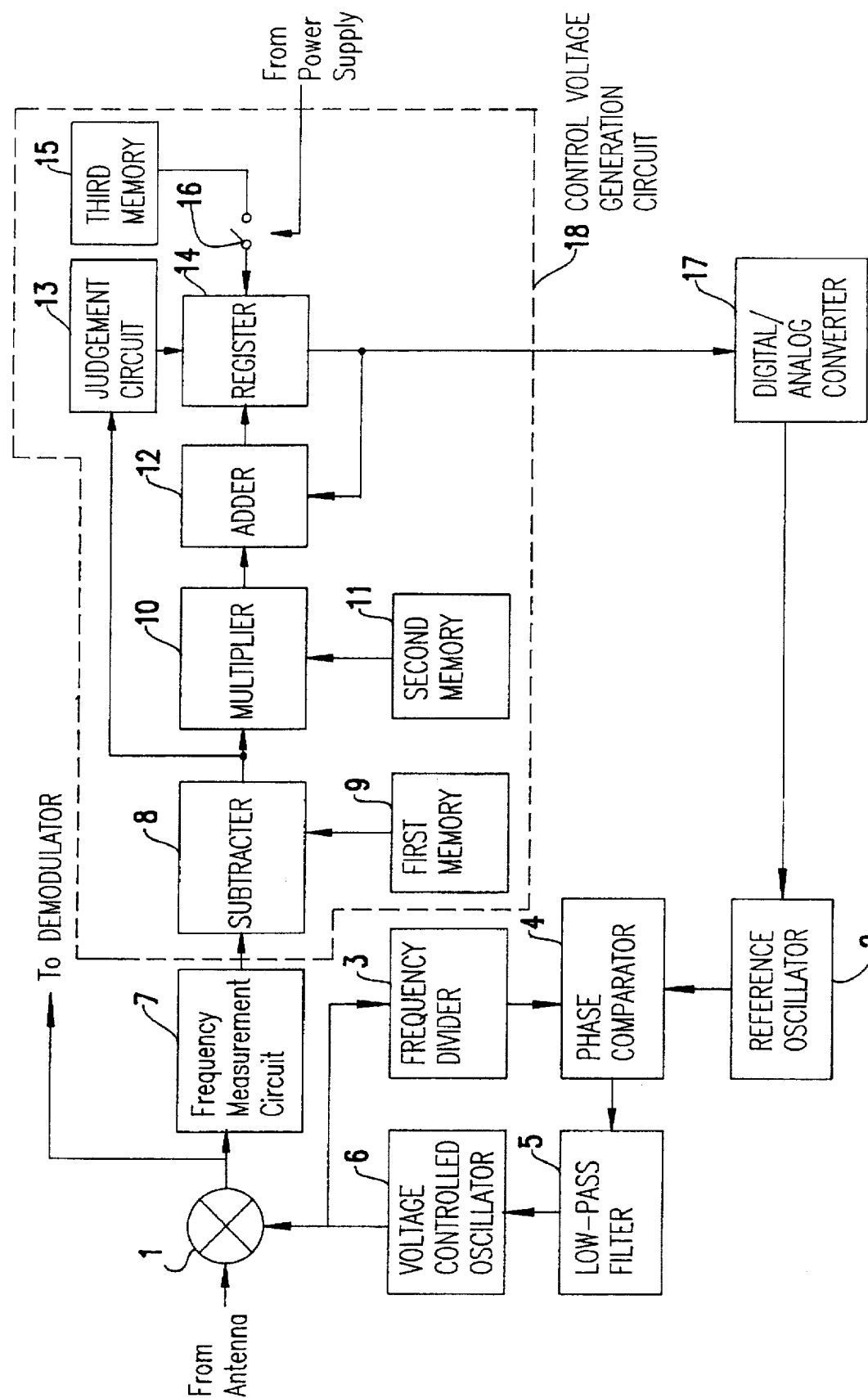
FIG. 1 is a block diagram schematically showing an automatic frequency control device embodying the present invention.

Referring to FIG. 1 of the drawings, an automatic frequency control device embodying the present invention is shown. As shown, the device is generally made up of a frequency mixer 1, a reference oscillator 2, a frequency divider 3, a phase comparator 4, a low-pass filter 5, a voltage controlled oscillator 6, a frequency measurement circuit 7, and a control voltage signal generation circuit 18. The circuit 18 has a subtracter 8, a first memory 9, a multiplier 10, a second memory 11, an adder 12, a judgement circuit 13, a register 14, a third memory 15, a switch 16, and a digital/analog (A/D) converter 17.

The operations of the various circuits shown in FIG. 1 will be outlined. The frequency mixer 1 subtracts a received signal from an antenna, not shown, from the frequency of a local oscillation signal output from the voltage controlled oscillator 6, thereby producing an IF signal. The IF signal is delivered to a demodulator, not shown, and the frequency measurement circuit 7.

The reference oscillator 2 outputs a reference oscillation signal whose frequency corresponds to a control voltage output from the D/A converter 17. The frequency divider 3 divides the frequency of the local oscillation signal to thereby output a frequency divided signal. The phase comparator 4 compares the phase of the reference signal with that of the frequency divided signal and outputs a signal representative of their difference, i.e., a phase difference signal. The low-pass filter 5 filters out high frequency components included in the phase difference signal. The voltage controlled oscillator 6 outputs a local oscillation signal based on the phase signal output from the low-pass filter 5.

The reference oscillator 2, frequency divider 3, phase comparator 4, low-pass filter 5 and the voltage controlled oscillator 6 constitute a phase locked loop (PLL). The PLL can tune the IF signal to the target frequency.

The control voltage generation circuit 18 receives, in response to power-up, a power ON signal and, in turn, outputs a control voltage signal which will be described. The control voltage signal generation circuit 18 calculates a difference between the frequency of the IF signal and a desired frequency and corrects the control voltage signal on the basis of the difference.

Figure 2A:
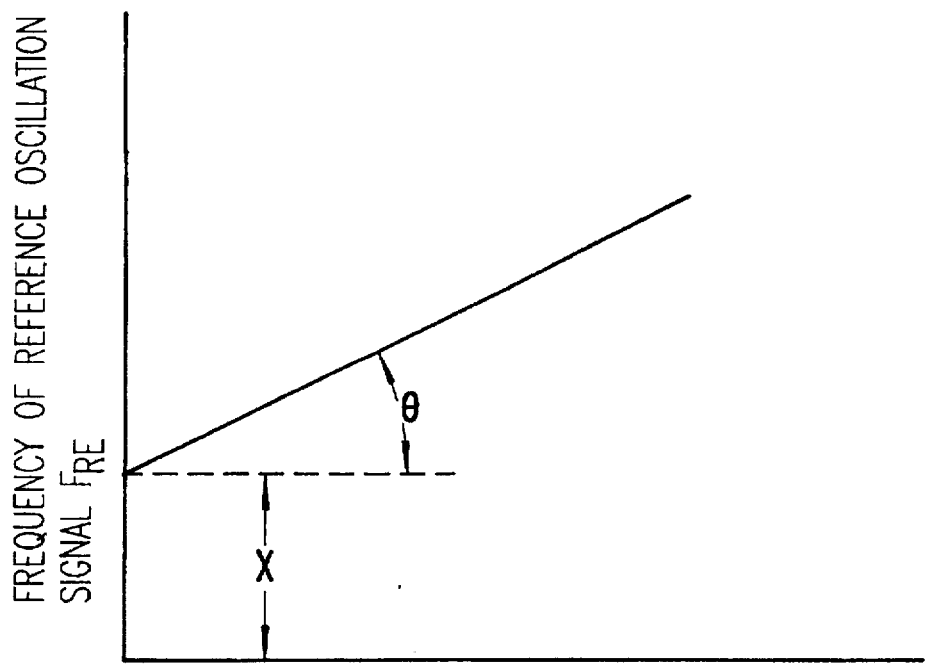
FIGS. 2(A) and 2(B) respectively show a relation between a control voltage and the frequency of a reference oscillation signal, and a relation between the control voltage and the frequency of an IF signal available with the embodiment.

A reference will be made to FIGS. 2(A) and 2(B) for describing the principle of the control voltage signal generation circuit 18. As shown in FIG. 2(A), the reference oscillation signal from the reference oscillator 2 has a frequency $F_{RE}$ which is proportional to a voltage V represented by the control voltage signal from the register 14, i.e., the control voltage output from the D/A converter 17. The proportional relation has a gradient tan θ. Hence, the frequency $F_{RE}$ is expressed as:

$$F_{RE} = \tan\theta \cdot V + X \qquad \text{Eq. (1)}$$

where X is a constant.

Assume that the received signal from the antenna has a frequency $R_f$, and that the local oscillation signal from the voltage controlled oscillator 6 has a frequency $F_{RO}$. Then, the IF signal output from the frequency measurement circuit 7 has a frequency $F_M$ equal to a value produced by subtracting the frequency $R_f$ from the frequency $F_{RO}$:

$$F_M = F_{RO} - R_f \qquad \text{Eq. (2)}$$

Because the frequency $F_{RO}$ of the local oscillation signal is N times of the frequency $F_{RE}$ of the reference oscillation signal, the frequency $F_M$ of the IF signal is obtained from the Eqs. (1) and (2), as follows:

$$F_M = N(\tan\theta \cdot V + X) - R_f = N \cdot \tan\theta \cdot V + (N \cdot X - R_f) \qquad \text{Eq. (3)}$$

where N is a constant.

Figure 2B:
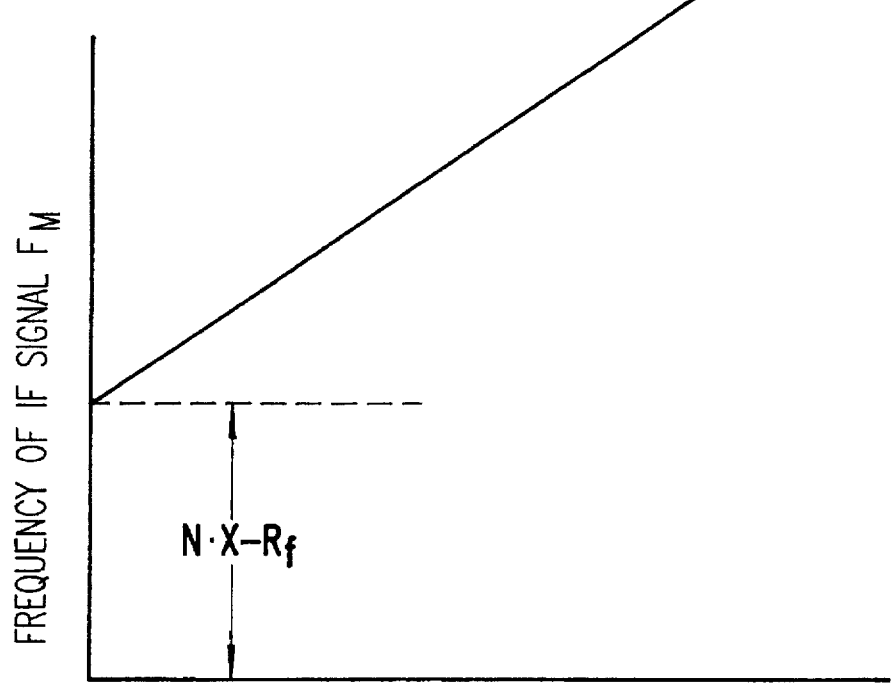

Hence, as shown in FIG. 2(B), when the frequency $R_f$ of the received signal is constant, the frequency $F_M$ of the IF signal is proportional to the voltage V represented by the control voltage signal and has a gradient N·tanS.

As stated above, the frequency of $F_M$ of the IF signal has a gradient N·tan θ relative to the voltage V represented by the control voltage signal. In accordance with the present invention, when the frequency of the IF signal is different from the desired or target frequency, the difference is multiplied by 1/N·tan θ to thereby produce a control voltage signal step width. The control voltage signal step width is added to or subtracted from the control voltage signal, so that the IF signal is tuned to the target frequency.

Figure 6:
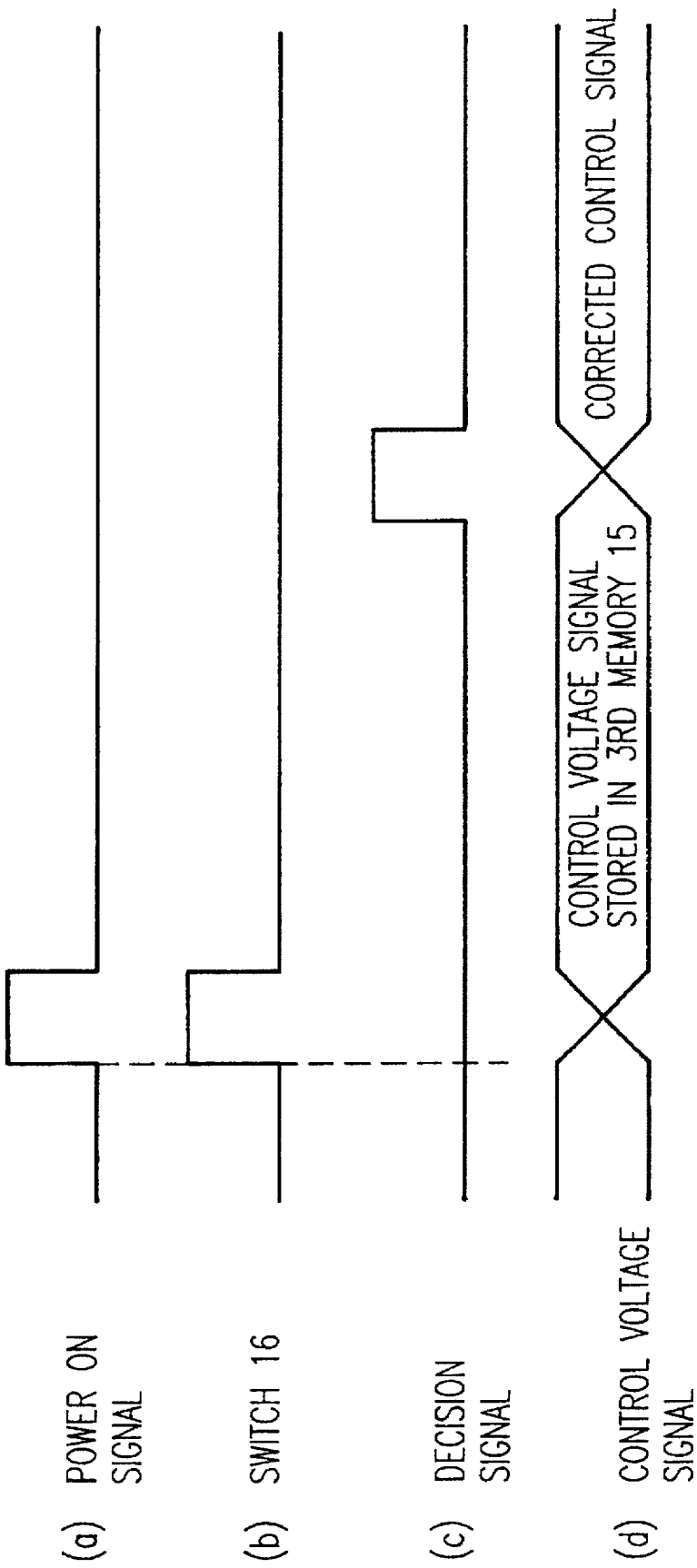
FIG. 6 is a timing chart representative of the operations of a judgement circuit, a register, and a switch shown in FIG. 1.

The operation of the embodiment will be described with reference to FIGS. 3(A), 3(B), 4, 5 and 6. First, as shown in FIG. 4, when a power source circuit, not shown, is switched on (step S101), a power ON signal is fed from the power source circuit to the switch 16 at a time t1 (FIG. 6). In response, the switch 16 turns on and remains in an ON state for a predetermined period of time (step S102 and FIG. 6). When the power source circuit is not switched on, the program returns. When the switch 16 turns on, a control voltage signal representative of a voltage α and stored in the third memory 15 is output via the register 14 (step S103 and FIG. 6). As for the control voltage signal, an arrangement is made such that the reference oscillator 2 outputs a frequency positioned at the middle of a range of frequencies which it may output.

The D/A converter 17 transforms the above control voltage signal to an analog signal (step S104), thereby producing a control voltage having the value α. The reference oscillator 2 produces, based on this control voltage, a reference oscillation signal having a frequency A (FIG. 3(A)) (step S105 and FIG. 3(A)).

The phase comparator 4 compares the phase of the reference oscillation signal having the frequency A and that of the frequency divided signal and outputs a phase difference signal (step S106). The low-pass filter 5 filters out the high frequency components of the phase difference signal (step S107). In response to the phase difference signal from the filter 5, the voltage controlled oscillator 6 outputs a frequency $V_{RO}$, i.e., a local oscillation signal having a frequency N·A because the frequency $F_{RO}$ is N times of the frequency $V_{RE}$ of the reference oscillation signal (step S108).

Figure 3A:
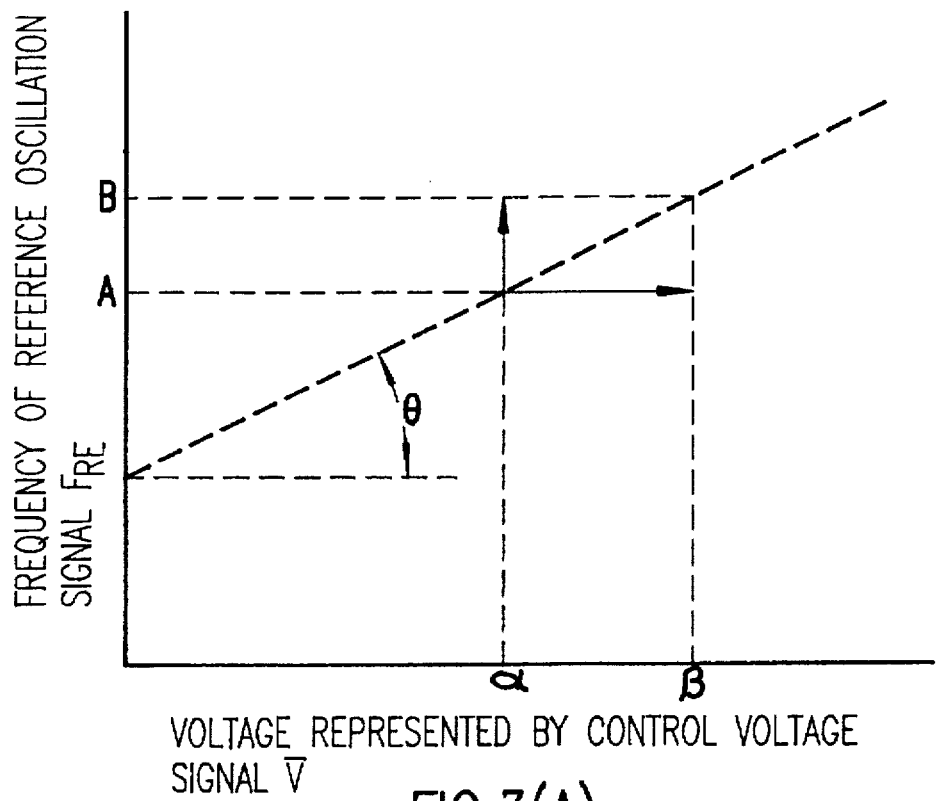
FIGS. 3(A) and 3(B) demonstrate a method of correcting the frequency of an IF frequency particular to the present invention.
Figure 3B:
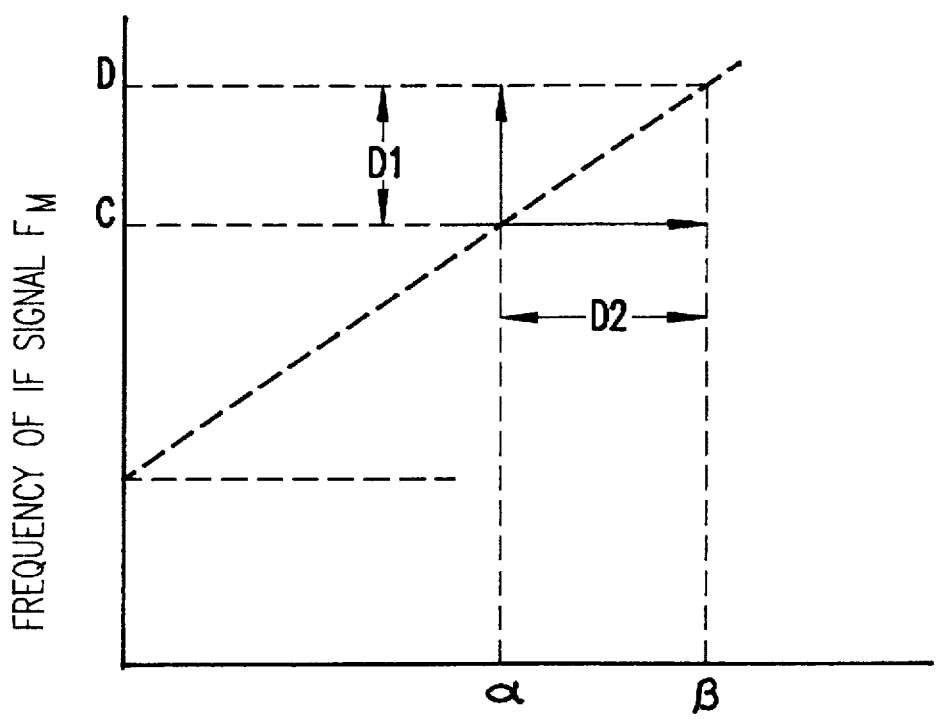
Figure 4:
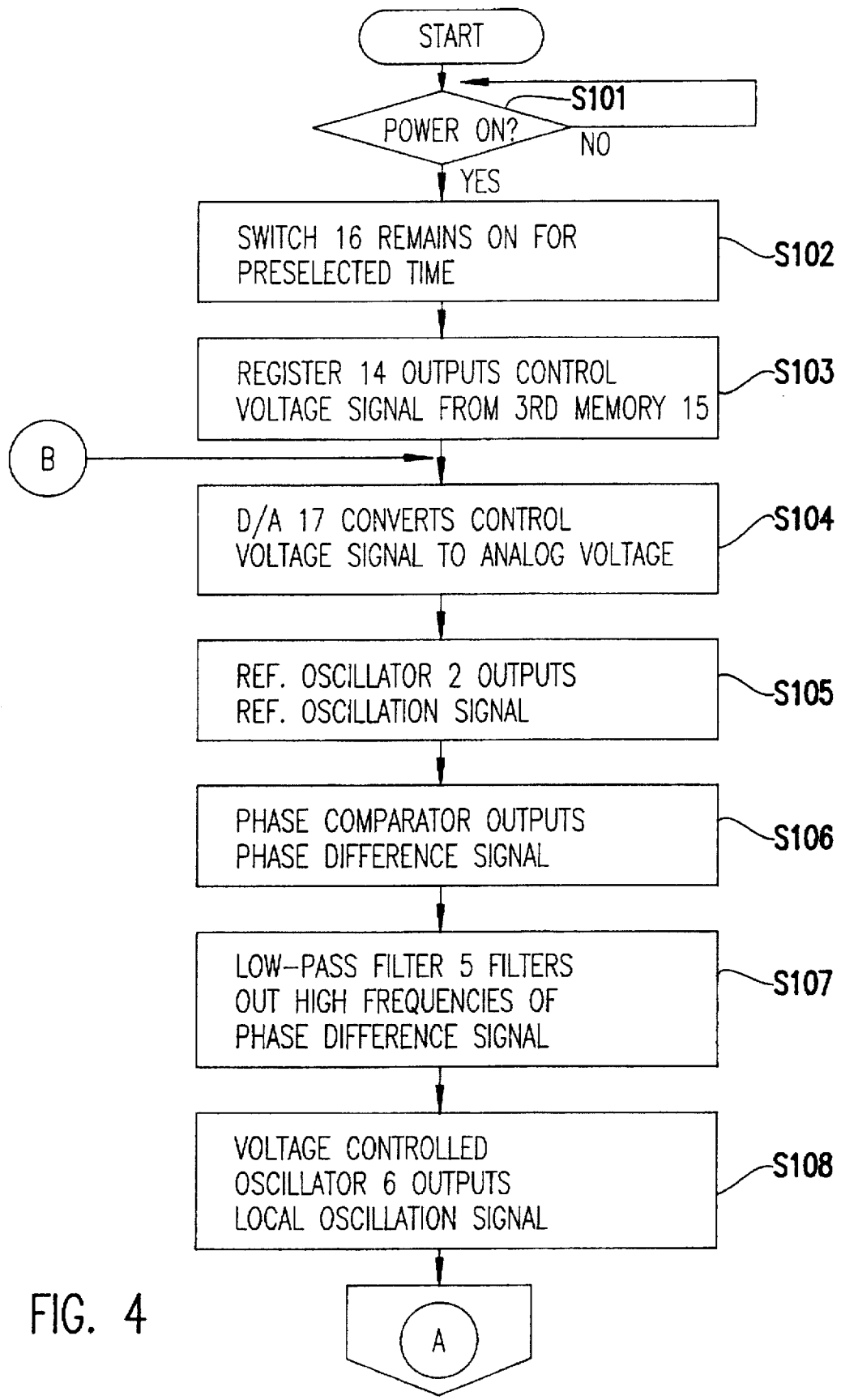
FIGS. 4 and 5 are flowcharts demonstrating, in combination, a specific operation of the embodiment.
Figure 5:
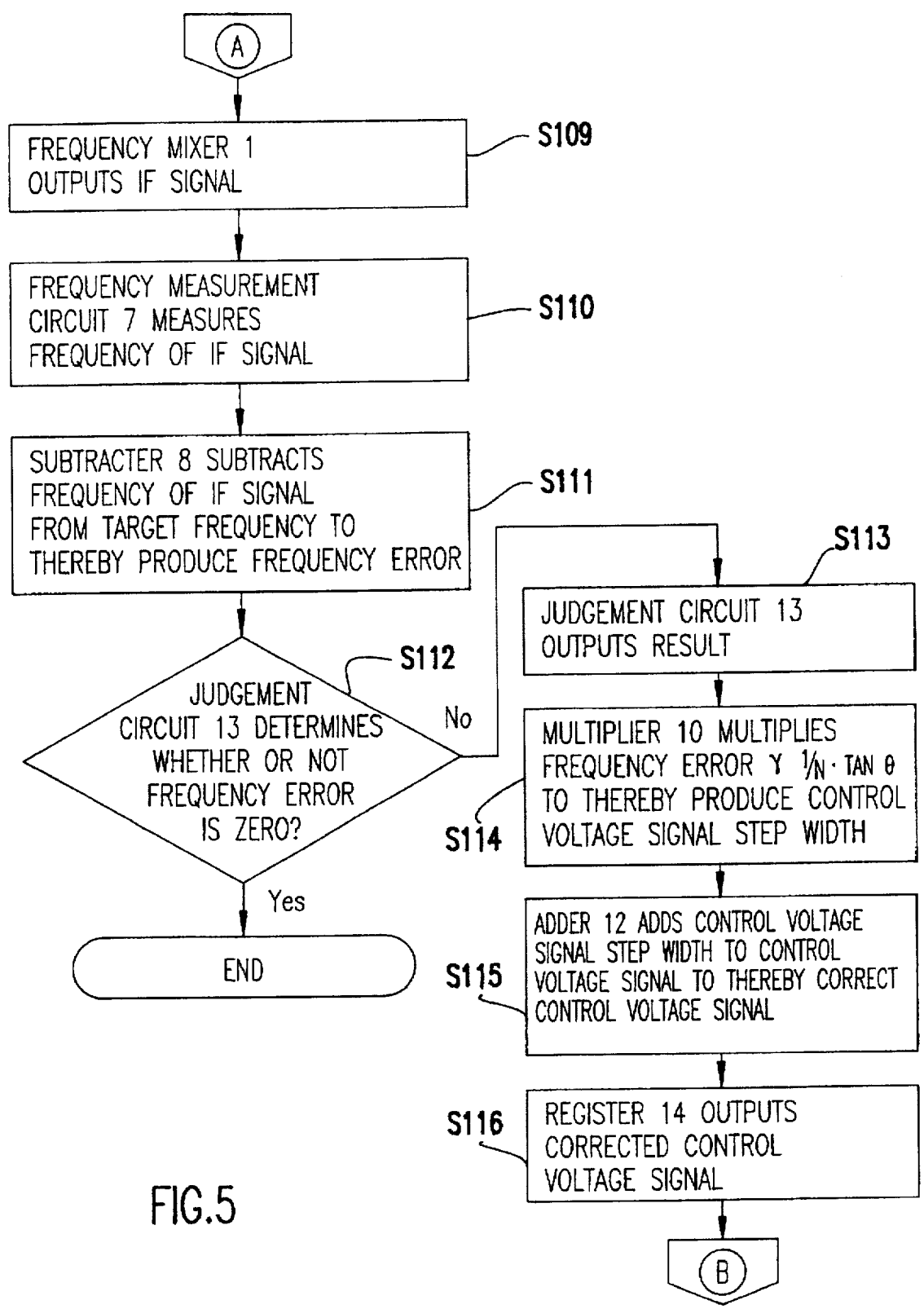

The frequency mixer 1 subtracts the frequency $R_f$ of the received signal from the frequency N·A of the local oscillation signal and thereby outputs an IF signal having a frequency C (step S109 and FIG. 3(B)). The frequency measurement circuit 7 measures the frequency C of the IF signal by using the reference frequency signal as a clock (step S110).

The subtracter 8 subtracts the frequency C measured by the circuit 7 from the target frequency D stored in the first memory 9 and to which the IF signal should be tuned, thereby producing a frequency error signal indicating a frequency error D1 (FIG. 3(B)) (step S111). The judgement circuit 13 determines whether or not the frequency error D1 indicated by the error signal is zero (step S112).

If the answer of S112 is negative, the judgement circuit 13 produces a judgement signal at a time t2 (step 113 and FIG. 6).

A multiplier 10 multiplies the error signal by a value 1/N·tan θ, which is stored in the second memory 11, and produces a step width D2 (step 114 and FIG. 3(B)). The adder 12 adds the control voltage having the value α, which is the output from the register 14, to the step width D2 and produces a corrected control voltage having a value β (step 115 and FIG. 3(B)). The register 14 stores, in response to the judgement signal, the corrected control voltage having the value β at a time t2, and supplies the control voltage to the D/A converter 17, (step 116 and FIG. 6).

The next process goes to step S104 once again.

The D/A converter 17 transforms the above control voltage signal having the values β to an analog signal (step S104), thereby producing a control voltage having the value β. The reference oscillator 2 produces, based on this control voltage, a reference oscillation signal having a frequency B (step S105 and see FIG. 3(A)).

The phase comparator 4 compares the phase of the reference oscillation signal having the frequency B and that of the frequency divided signal and outputs a phase difference signal (step S106). The low-pass filter 5 filters out the high frequency components of the phase difference signal (step S107). In response to the phase difference signal from the filter 5, the voltage controlled oscillator 6 outputs a frequency $V_{RO}$, i.e., a local oscillation signal having a frequency N·B because the frequency $F_{RO}$ is N times of the frequency $V_{RE}$ of the reference oscillation signal (step S108).

The frequency mixer 1 subtracts the frequency $R_f$ of the received signal from the frequency N·B of the local oscillation signal and thereby outputs an IF signal having a frequency D (see, FIG. 3(B)), (step S109). The frequency measurement circuit 7 measures the frequency D of the IF signal by using the reference frequency signal as a clock (step S110).

The subtracter 8 subtracts the frequency D measured by the circuit 7 from the target frequency D stored in the first memory 9 and to which the IF signal should be tuned, thereby producing a frequency error signal indicating a frequency error D1 (step S111 and see FIG. 3(B)). The judgement circuit 13 determines whether or not the frequency error D1 indicated by the error signal is zero (step S112). In this way, these steps continue until the error signal becomes zero. When the answer of the step S112 is positive (Yes), the automatic frequency control ends.

Thereafter, no judgement signals are output, and the register 14 continuously outputs the control voltage signal representative of the voltage β. The IF signal remains stable at the target frequency D.

In summary, it will be seen that the present invention provides an automatic frequency control device which multiplies a difference of an IF signal from a desired or target frequency, to which it should be tuned, by the value 1/N·tan θ and corrects the control voltage signal on the basis of the resulting product. Hence, the device is capable of tuning the IF signal to the target frequency by performing correction only once.

While the embodiment has been shown and described in relation to an automatic frequency control circuit for tuning the IF signal of a radio apparatus to a target frequency, the present invention is not limited to this kind of automatic frequency control circuit. The present invention is, therefore, applicable to any kind of apparatus which tunes a signal to a desired frequency.

Obviously, numerous additional modifications and variations of the present invention are possible in light of the above teachings. It is, therefore, to be understood that within the scope of the appended claims, the invention may be practiced otherwise than as specifically described herein.

What is claimed is:

1. An automatic frequency control device comprising:
   signal generating means for generating a signal on the basis of a control signal;
   detecting means for detecting a frequency difference of said signal from a target frequency to which a frequency of said signal should be tuned; and
   correcting means for correcting said control signal on the basis of a proportional relation between said control signal and said frequency of said signal when said detecting means detects said frequency difference,
   wherein said signal generating means comprises:
   control voltage generating means for outputting said control signal as a control voltage;
   reference oscillating means for outputting a reference oscillation signal on the basis of said control voltage;
   local oscillating means for outputting a local oscillation signal synchronous in phase to said reference oscillation signal; and
   frequency mixing means for mixing a received signal and said local oscillation signal to thereby output said signal as an intermediate frequency (IF) signal having a frequency intermediate that of said received signal and said local oscillation signal, and
   wherein said correcting means comprises:
   multiplying means for multiplying said difference between said signal and said target frequency by a reciprocal of a gradient of said control voltage relative to a frequency of said IF signal in said proportional relation; and
   adding means for adding a product, produced by said multiplying means, to said control voltage.

2. The device as claimed in claim 1, further comprising a second memory for storing said reciprocal of the gradient.

3. The device as claimed in claim 1, further comprising:
   a third memory for storing said control voltage causing said reference oscillating means to output an intermediate frequency of a range of frequencies which said reference oscillation signal can have;

a switch connected to an output of said third memory and controlled ON in response to a power-up;

deciding means for determining whether said IF signal has been tuned to said target frequency; and a register for holding, when said switch is controlled ON, said control voltage stored in said third memory and outputting said control voltage, and for replacing, when said deciding means determines that said IF signal has been tuned to said target frequency, said control voltage with an output of said adding means.

4. An automatic frequency control device comprising:

signal generating means for generating a signal on the basis of a control signal;

detecting means for detecting a frequency difference of said signal from a target frequency to which a frequency of said signal should be tuned; and correcting means for correcting said control signal on the basis of a proportional relation between said control signal and said frequency of said signal when said detecting means detects said frequency difference, wherein said signal generating means comprises:

control voltage generating means for outputting said control signal as a control voltage;

reference oscillating means for outputting a reference oscillation signal on the basis of said control voltage;

local oscillating means for outputting a local oscillation signal synchronous in phase to said reference oscillation signal; and frequency mixing means for mixing a received signal and said local oscillation signal to thereby output said signal as an intermediate frequency (IF) signal having a frequency intermediate that of said received signal and said local oscillation signal, said device further comprising initial value setting means for outputting, in response to a power-up, an initial value which includes a control voltage causing said reference oscillating means to output an intermediate frequency of a range of frequencies which said reference oscillation signal can have.

5. An automatic frequency control device comprising:

signal generating means for generating a signal on the basis of a control signal;

detecting means for detecting a frequency difference of said signal from a target frequency to which a frequency of said signal should be tuned; and correcting means for correcting said control signal on the basis of a proportional relation between said control signal and said frequency of said signal when said detecting means detects said frequency difference, wherein said signal generating means comprises:

control voltage generating means for outputting said control signal as a control voltage;

reference oscillating means for outputting a reference oscillation signal on the basis of said control voltage;

local oscillating means for outputting a local oscillation signal synchronous in phase to said reference oscillation signal; and frequency mixing means for mixing a received signal and said local oscillation signal to thereby output said signal as an intermediate frequency (IF) signal having a frequency intermediate that of said received signal and said local oscillation signal, said device further comprising:

deciding means for determining whether said IF signal has been tuned to said target frequency; and holding means for holding a control voltage appearing when said deciding means decides that said IF signal has been tuned to said target frequency.

6. A method of automatically controlling a frequency, comprising steps of:

(a) generating a signal on the basis of a control signal;

(b) detecting a frequency difference of said signal from a target frequency to which a frequency of said signal should be tuned; and (c) correcting said control signal on the basis of a proportional relation between said control signal and said frequency of said signal when said frequency difference is detected, wherein step (a) comprises:

(d) outputting said control signal as a control voltage;

(e) outputting a reference oscillation signal on the basis of said control voltage;

(f) outputting a local oscillation signal synchronous in phase to said reference oscillation signal; and (g) mixing a received signal and said local oscillation signal for thereby outputting said signal as an IF signal, and wherein step (c) comprises:

(j) multiplying the difference of the frequency of said IF signal from said target frequency by a reciprocal of a gradient of said control voltage relative to the frequency of said IF signal in said proportional relation; and (k) adding a product produced in step (j) to said control voltage.

7. A method of automatically controlling a frequency, comprising steps of:

(a) generating a signal on the basis of a control signal;

(b) detecting a frequency difference of said signal from a target frequency to which a frequency of said signal should be tuned; and (c) correcting said control signal on the basis of a proportional relation between said control signal and said frequency of said signal when said frequency difference is detected, wherein step (a) comprises:

(d) outputting said control signal as a control voltage;

(e) outputting a reference oscillation signal on the basis of said control voltage;

(f) outputting a local oscillation signal synchronous in phase to said reference oscillation signal; and (g) mixing a received signal and said local oscillation signal for thereby outputting said signal as an IF signal, said method further comprising:

(l) outputting, in response to a power-up, an intermediate frequency of a range of frequencies which said reference oscillation signal can have.

8. A method of automatically controlling a frequency, comprising steps of:

(a) generating a signal on the basis of a control signal;

(b) detecting a frequency difference of said signal from a target frequency to which a frequency of said signal should be tuned; and (c) correcting said control signal on the basis of a proportional relation between said control signal and said frequency of said signal when said frequency difference is detected, wherein step (a) comprises:
- (d) outputting said control signal as a control voltage;
- (e) outputting a reference oscillation signal on the basis of said control voltage;
- (f) outputting a local oscillation signal synchronous in phase to said reference oscillation signal; and
- (g) mixing a received signal and said local oscillation signal for thereby outputting said signal as an IF signal, said method further comprising:
- (m) determining whether said IF signal has been tuned to said target frequency; and
- (n) holding a control voltage appearing when said IF signal is tuned to said target frequency.

9. An automatic frequency control device comprising:

signal generating means for generating a signal on the basis of a control signal;

detecting means for detecting a frequency difference of said signal from a target frequency to which a frequency of said signal should be tuned; and correcting means for correcting said control signal on the basis of a proportional relation between said control signal and said frequency of said signal when said detecting means detects said frequency difference, wherein said correcting means includes:
multiplying means for multiplying said difference between said signal and said target frequency by a reciprocal of a gradient of said control voltage relative to a predetermined frequency; and adding means for adding a product, produced by said multiplying means, to said control voltage.

10. A method of automatically controlling a frequency, comprising steps of:
- (a) generating a signal on the basis of a control signal;
- (b) detecting a frequency difference between said signal and a target frequency to which a frequency of said signal should be tuned; and
- (c) correcting said control signal on the basis of a proportional relation between said control signal and said frequency of said signal when said frequency difference is detected, wherein step (a) comprises:
- (d) outputting said control signal as a control voltage;
- (e) outputting a reference oscillation signal on the basis of said control voltage;
- (f) outputting a local oscillation signal synchronous in phase to said reference oscillation signal; and
- (g) mixing a received signal and said local oscillation signal for thereby outputting said signal as an IF signal, wherein step (c) includes:
multiplying the difference of the frequency of said IF signal from said target frequency by a reciprocal of a gradient of said control voltage relative to the frequency of said IF signal.

* * * * *